US 6,740,982 B2

(12) United States Patent
Sauter et al.

(10) Patent No.: US 6,740,982 B2
(45) Date of Patent: May 25, 2004

(54) MICROELECTRONIC PACKAGE WITH AN ATTACHMENT LAYER INCLUDING SPACER ELEMENTS

(75) Inventors: Klaus Sauter, Blaubeuren (DE); Joerg Mahrle, Goeppingen (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 98 days.

(21) Appl. No.: 10/016,495

(22) Filed: Oct. 30, 2001

(65) Prior Publication Data

US 2002/0063321 A1 May 30, 2002

Related U.S. Application Data

(63) Continuation-in-part of application No. PCT/EP00/03140, filed on Apr. 7, 2000.

(30) Foreign Application Priority Data

Apr. 30, 1999 (DE) .......................................... 199 19 716

(51) Int. Cl.$^7$ .......................... H01L 23/48; H01L 23/52; H01L 29/40
(52) U.S. Cl. ....................... 257/780; 257/781; 257/782; 257/783
(58) Field of Search ................................. 257/780–783

(56) References Cited

U.S. PATENT DOCUMENTS 4,295,117 A    10/1981   Lake et al.
4,545,840 A    10/1985   Newman et al.
5,232,962 A   *   8/1993   Dershem et al. ............ 523/442

FOREIGN PATENT DOCUMENTS

| DE | 2756500    | 6/1979  |
| DE | G9116206   | 5/1992  |
| JP | 60253280   | 12/1985 |
| WO | WO97/22993 | 6/1997  |

OTHER PUBLICATIONS

IBM Technical Disclosure Bulletin, "Chip–Heatsink Attach Using Contoured Adhesive With Glass Stand–Offs"; IBM Technical Disclosure Bulletin, vol. 34, No. 3; Aug. 1, 1991; IBM Corporation, New York, pp. 161, 162.

* cited by examiner

*Primary Examiner*—Thien F Tran
(74) *Attorney, Agent, or Firm*—W. F. Fasse; W. G. Fasse

(57) ABSTRACT

A microelectronic package includes a microelectronic component, such as a sensor component, attached to a substrate by an attachment layer of an adhesive, in which approximately spherical spacer elements are dispersed. The nominal diameter of the spacer elements corresponds to a specified stand-off distance between the mounting surface of the electronic component and the substrate. The spacer elements are made of a plastic material having a coefficient of thermal expansion that approximates the coefficient of expansion of the adhesive (e.g. the expansion coefficient of the adhesive is no more than 10 times the expansion coefficient of the plastic material of the spacer elements). When temperature changes occur, the spacer elements do not rigidly maintain the stand-off distance and so lead to distortion, but instead absorb at least a small amount of the arising strain by elastically deforming.

20 Claims, 1 Drawing Sheet

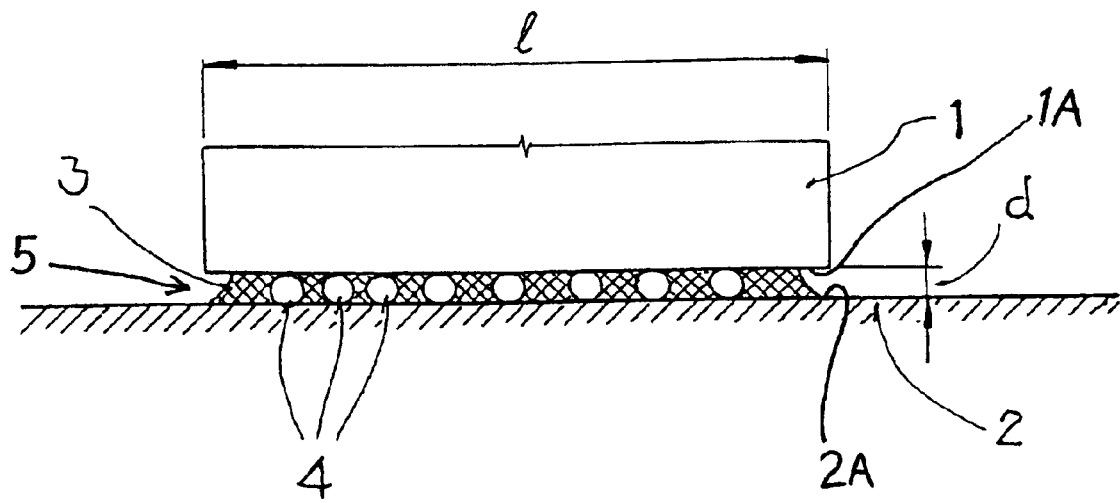

MICROELECTRONIC PACKAGE WITH AN ATTACHMENT LAYER INCLUDING SPACER ELEMENTS

CROSS-REFERENCE TO RELATED APPLICATION

This application is a Continuation-In-Part under 35 U.S.C. §120 of copending PCT International Application PCT/EP00/03140, which was filed on Apr. 7, 2000, which designated and then elected the United States of America, and which was published under PCT Article 21(2) on Nov. 9, 2000 in a language other than English. The entire disclosure of PCT/EP00/03140 is incorporated herein by reference.

PRIORITY CLAIM

This application claims the priority under 35 U.S.C. §119 of German Patent Application 199 19 716.4, filed on Apr. 30, 1999, through the PCT International Application PCT/EP00/03140.

FIELD OF THE INVENTION

The present invention relates to a microelectronic package including an electronic component which is attached to a substrate element by an attachment layer comprising an adhesive and spherical spacer elements provided in the adhesive.

BACKGROUND INFORMATION

It is generally known to use approximately spherical particles as spacers in a glued joint between two microelectronic packages. For example, German Patent Application Laying-Open Publication 2,756,500 discloses such an arrangement in which the spherical particles have a diameter equal to the desired stand-off, and a multitude of them are distributed in the adhesive layer to form the spacer means.

In German Utility Model Publication 91 16 206, spherical bodies are used as spacer elements between insulating glass plates. The spacer elements are plastically deformed superficially to form flattened areas under the effect of increased pressure, as a result of which the manufacturing tolerances of the spherical spacer elements can be reduced to a set stand-off by pressing.

Furthermore, in practice, packages with force-sensitive sensor elements, for example acceleration sensors for automotive vehicles, are attached to a substrate element, for example a printed circuit board, by adhesively bonding them together using an adhesive with such spherical spacer elements dispersed therein. Previously, glass balls have been used as spherical spacer elements for this purpose, because they are electrostatically insensitive, are relatively easy to mix into the adhesive, can be distributed in it, and are very cheap and readily available. However, serious disadvantages arise with the use of such glass ball spacer elements. Due to the cross-linking of the adhesive layer at a defined hardening temperature lying above the operating temperature range of the application, measurable distortions between the component and the adhesive layer are caused on the sensor element. Such distortions result, or are exacerbated because the glass balls have a significantly different elasticity and thermal expansion characteristic in comparison to the curing adhesive. As a result, these distortions lead to an additional shifting of the electrical zero point of the component. This must be compensated by an offset for the variable to be detected. However, despite this offset compensation, other measuring inaccuracies commonly occur, particularly if the component had only been attached by one drop of adhesive.

For example, the problem of mechanical distortion under temperature changes in the environment of a sensor is also known from U.S. Pat. No. 4,295,117. A base plate is selected with approximately the same coefficient of thermal expansion as that of the sensor chip. A pedestal and a substrate die are bonded to each other and to the chip by an elastic adhesive, and are arranged between the base plate and the chip so that the chip is isolated from the distortions of the base plate. Nevertheless, unwanted distortions can occur even within this bond when the adhesive compensates for the differing changes in length.

An electronic package, for example a BGA, is further known from the PCT International Publication WO 97/22993, in which the coefficients of thermal expansion of the spacer elements are matched to the coefficients of thermal expansion of the two components which are to be bonded to them. Generally, the spacer elements have a coefficient of thermal expansion which is significantly less than, and especially not greater than that of the adhesive. Glass ($SiO_2$) or corundum (aluminum oxide $Al_2O_3$) are proposed as materials for the spacer elements. These materials are rigid and have a coefficient of thermal expansion significantly less than that of the adhesive, e.g. these materials have a thermal expansion coefficient much less than one tenth of that of the adhesive or typically about one hundredth of that of the adhesive or even less.

SUMMARY OF THE INVENTION

In view of the above, it is an object of the invention to provide a microelectronic package with an attachment layer including spacer elements in an adhesive, whereby mechanical distortions resulting from different thermal expansion characteristics of the various components can be avoided or minimized, and wherein the overall attachment layer provides an improved resilient compensation of any expansion differences or the like between the electronic component and the substrate on which it is attached. Another object of the invention is to reduce the manufacturing and operating tolerances and to simplify the assembly. The invention further aims to avoid or overcome the disadvantages of the prior art, and to achieve additional advantages, as apparent from the present specification.

The above objects have been achieved according to the invention in a microelectronic package comprising a microelectronic component attached to a substrate by an attachment layer including an adhesive and a plurality of approximately spherical, spheroidal or ball-shaped spacer elements. The nominal diameter of the spacer elements at any given temperature corresponds to or essentially determines a specified stand-off distance between the mounting surface of the microelectronic component and the facing surface of the substrate. The individual spacer elements do not necessarily all have exactly the same diameter corresponding to the nominal diameter, but instead have actual diameters within a typical plus/minus range around the stated nominal diameter, for example corresponding to the nominal diameter ±5%. The nominal diameter may be an average diameter or a maximum diameter determined by sieve grading or the like.

The spacer elements comprise a plastic material that is at least somewhat elastically flexible, e.g. being more easily elastically deformed than prior art glass or corundum balls used as spacer elements, or more easily elastically deformed than the adjoining substrate or electronic component surfaces. The plastic material may be a single polymer of a single type of monomer, or may be a mixture or copolymer of plural different polymers. The spacer elements preferably essentially consist of the above described plastic material.

The plastic material is preferably selected so that the coefficient of thermal expansion of the spacer elements approximately corresponds to the coefficient of thermal expansion of the adhesive. This means, for example, that the coefficient of thermal expansion of the spacer elements is closer to the coefficient of thermal expansion of the adhesive, than is the coefficient of thermal expansion of the microelectronic component or the substrate. This further means, for example, that the coefficient of thermal expansion of the spacer elements is closer to that of the adhesive than is the thermal expansion coefficient of glass or corundum. More particularly, this further means that the coefficient of thermal expansion of the spacer elements is less than that of the adhesive by a factor of not more than 10, i.e. the coefficient of thermal expansion of the spacer elements is at least one tenth of (but preferably not more than) the coefficient of thermal expansion of the adhesive ($CTE_{spacer} \geq 0.1 \times CTE_{adhesive}$).

A microelectronic package according to the invention is further developed in comparison to the prior art, so that it has lower tolerances and can be easily assembled.

A temperature-dependent distortion of the microelectronic component such as a sensor has been determined to be the cause of the above-discussed measuring inaccuracies, which arise from the very different coefficients of thermal expansion of the adhesive on the one hand and the spherical spacer elements on the other hand in the prior art arrangements. This gave rise to a shear effect between the glass balls and the mounting surface of the electronic component when the adhesive layer contracted at low temperatures. If this is compensated by an offset for a normal temperature, then at higher temperatures, and thus a lower shear effect, deviations occur once again.

Using spacer elements according to the present invention, with a coefficient of thermal expansion approximately corresponding to the coefficient of thermal expansion of the adhesive, i.e. at least significantly nearer than that of the prior art glass balls, has achieved a significant improvement in the manufacturing yield and a lower tolerance range.

Plastic balls or ball-shaped spacer elements having a generally spherical or spheroidal shape, whose coefficient of thermal expansion can be relatively well controlled, are preferably used for this purpose according to the invention. Plastic balls admittedly have a lower density and a tendency toward electrostatic charging, however this can already be compensated for by appropriate steps (e.g. adding any conventional anti-static agent) during the mixing of the adhesive and the spacer elements. The particular advantage of the plastic, apart from the approximation of the coefficient of thermal expansion of the adhesive, is its elasticity and elastic deformability, which have enabled the shear effect to be reduced still further.

Particularly, the coefficient of thermal expansion of the spacer element is less than that of the adhesive by a factor of no more than 10. Thereby, an adequate approximation of the coefficient of thermal expansion of the adhesive and a significant improvement of the temperature and manufacturing tolerances could be established.

BRIEF DESCRIPTION OF THE DRAWING

In order that the invention may be clearly understood, it will now be described in connection with an example embodiment, with reference to the accompanying drawing, of which the single FIGURE is a schematic side view of a microelectronic component bonded to a substrate element by an attachment layer according to the invention.

DETAILED DESCRIPTION OF THE PREFERRED EMBODIMENTS

The single drawing FIGURE is a sketch of a microelectronic package including a microelectronic component 1, for example a piezoelectric or capacitive acceleration sensor element, with a mounting surface 1A, here the underside 1A of the component 1, which is bonded by an attachment layer 5 to a substrate element 2, for example a printed circuit board. The attachment layer 5 includes a layer of adhesive 3 and a multitude of approximately spherical spacer elements 4 distributed in the adhesive layer 3, to achieve a specified stand-off distance d, between the component 1 and the substrate element 2. Thereby, the specified stand-off distance d corresponds essentially to the nominal diameter of the spacer elements 4, i.e. there is only one layer or thickness of the spacer elements 4 between the component 1 and the substrate 2, and at least most of the spacer elements each individually contact both the mounting surface 1A of the component 1 and the facing surface 2A of the substrate 2. In the FIGURE the thickness of the adhesive layer 3, the stand-off distance d, and the diameter of the approximately spherical spacer elements 4 have been magnified or exaggerated in comparison to the other drawing elements for greater clarity. In actual applications, the diameter of the spacer elements 4 and thus the stand-off d lies, for example, between 50 and 200 $\mu$m or a more-limited range of 150 to 200 $\mu$m. The particular size is selected based on the required stand-off d.

With conventional glass balls as spacer elements, even if they would be provided with the present relatively small diameters, a distortion of the mounting surface of the component 1 could arise because the adhesive 3, for example silicone adhesive, usually has a coefficient of thermal expansion of around $8 \times 10^{-4}$ 1/K, whereas glass has a coefficient of thermal expansion which is lower by a factor of around 100, i.e. approximately $8 \times 10^{-6}$ 1/K.

Such distortions can be significantly reduced by means of the inventive spacer elements 4 with a coefficient of expansion more closely approximating that of the adhesive, which, in particular, is lower than that of the adhesive by a factor of not more than 10. Generally, for example, the spacer elements 4 may have a thermal expansion coefficient on the order of $10^{-4}$ or $10^{-5}$ 1/K, and more particularly a range of $4 \times 10^{-5}$ 1/K to $2 \times 10^{-4}$ 1/K. Also, the spacer elements may typically have a modulus of elasticity giving them an elastic flexibility, deformability and resiliency. Thereby, the spacer elements 4 do not remain rigid when temperature fluctuations occur (which would otherwise cause a shear effect), but instead the spacer elements 4 absorb the strain themselves by correspondingly elastically deforming, at least to a small extent.

The adhesive 3 may be any conventionally known adhesive, such as a thermoset or a thermoplastic adhesive, or especially an epoxy resin adhesive or a silicone adhesive, which are typically used for attachment layers for joining electronic components onto substrates. The particular adhesive is preferably selected with a coefficient of thermal expansion between those of the electronic component 1 and the substrate 2, or equal to that of either the electronic component 1 or the substrate 2. The component 1 and the substrate 2 are made up of any conventionally known materials used for such elements in a microelectronic package.

A variety of different plastic materials, either consisting of a single type of polymer or of a mixture or copolymer of at least two different polymers, may be suitably used in different applications.

In this context, the particular polymer material is selected depending on the coefficients of thermal expansion of the selected adhesive and of the electronic component and the substrate, the temperature range of operation of the particular application, the degree of accuracy to which the coefficient of thermal expansion should be matched, the price and availability of different plastics, the extent of elastically yielding compensation, adaptation and "cushioning" that is to be provided by the elements, etc. It is also possible to proportionally mix two or more plastics to achieve the properties required for the application.

Thus, a plastics mixture with a coefficient of thermal expansion of 4 to $6 \times 10^{-5}$ 1/K is easily feasible and can be used for the inventive spacer elements 4. The temperature-dependency of the component thereby already becomes significantly less. A still nearer approximation of the thermal expansion coefficient of the adhesive means a higher expenditure, but is achievable in principle. The remaining difference between the thermal elasticity of the spacer elements and that of the adhesive, which may still be substantial, e.g. up to a factor of 10, is nonetheless already a significant advance and improvement because of the extremely high sensitivity of the sensor element. So, in the actual application case in which the electronic component 1 comprises an acceleration sensor, accelerations are recorded with an accuracy of 0.1 g, which corresponds to a stand-off change of 0.02 $\mu$m between the internal seismic mass of the sensor element and the fixed floor, whereby the measuring range goes up to 3 g. The operating temperature range must be designed from $-40°$ C. to $+120°$ C. for automotive vehicle sensor applications.

In this case, i.e. for such a temperature range and such an application, while the conventional glass balls have a thermal expansion of a maximum of 0.25 $\mu$m at a stand-off of 200 $\mu$m, the adhesive changes by about 25 $\mu$m in the corresponding dimension. In contrast, the plastic spacer elements attain a flexibility of at least 2 $\mu$m which, assuming a measuring accuracy of 0.02 $\mu$m and a maximum dynamic range of the seismic mass in the sensor element of 0.7 $\mu$m, already means a significant improvement in the thermal behavior. The plastic material therefore also has a sufficient modulus of elasticity to enable the spacer elements to elastically deform to accommodate or adapt to the different expansions and the like, and thereby take up arising strains.

In particular, it is thus possible to attach the electronic component 1 to the substrate element 2 by a single drop of adhesive 3 with the spacer elements 4 dispersed therein applied onto the substrate 2, upon which the component 1 is pressed centrally. The component 1 had previously (conventionally) been glued at each corner in order to achieve acceptable thermal behavior.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A microelectronic package comprising:
   a microelectronic component having a mounting surface;
   a substrate having a facing surface; and
   an attachment layer that is interposed between and bonded to said mounting surface of said microelectronic component and said facing surface of said substrate so as to attach said microelectronic component onto said substrate;
   wherein:
      said attachment layer comprises a layer of an adhesive, plural generally ball-shaped spacer elements dispersed in said adhesive, and an anti-static agent applied to said spacer elements or mixed in said adhesive;
      said spacer elements respectively have a nominal diameter that corresponds to a stand-off distance between said mounting surface of said microelectronic component and said facing surface of said substrate; and
      said spacer elements comprise a plastic material that is at least slightly elastically flexible and resilient.

2. The microelectronic package according to claim 1, wherein said adhesive has a first coefficient of thermal expansion, and said plastic material of said spacer elements has a second coefficient of thermal expansion that at least approximately corresponds to said first coefficient of thermal expansion of said adhesive.

3. The microelectronic package according to claim 1, wherein said adhesive has a first coefficient of thermal expansion, and said plastic material of said spacer elements has a second coefficient of thermal expansion that is not less than one tenth of said first coefficient of thermal expansion of said adhesive.

4. The microelectronic package according to claim 1, wherein said plastic material is elastically flexible and resilient to such an extent so that said spacer elements exhibit an elastic flexible deformability of at least 1% of said nominal diameter in said attachment layer in said microelectronic package.

5. The microelectronic package according to claim 1, wherein said generally ball-shaped spacer elements respectively have a spherical or spheroidal shape.

6. The microelectronic package according to claim 1, wherein said nominal diameter is in a range from 150 $\mu$m to 200 $\mu$m.

7. The microelectronic package according to claim 1, wherein said spacer elements consist essentially of said plastic material, which consists essentially of a single polymer.

8. The microelectronic package according to claim 1, wherein said spacer elements consist essentially of said plastic material, which consists essentially of a mixture or copolymer of at least two different polymers.

9. The microelectronic package according to claim 1, wherein said spacer elements do not contain any silica glass, do not contain any alumina, and do not contain any metal.

10. The microelectronic package according to claim 1, wherein said microelectronic component comprises a sensor.

11. The microelectronic package according to claim 1, wherein said adhesive is a silicone adhesive.

12. The microelectronic package according to claim 1, wherein said attachment layer is formed from a single drop of said adhesive with said spacer elements dispersed therein, which drop has been applied on said facing surface of said substrate at a location centered relative to said mounting surface of said microelectronic component, and which drop then has been pressed between said facing surface and said mounting surface and thereafter cured to form said attachment layer.

13. A method of manufacturing the microelectronic package according to claim 1, comprising the following steps:

applying onto said facing surface of said substrate a single drop of said adhesive with said spacer elements dispersed therein and with said anti-static agent applied to said spacer elements or mixed in said adhesive;

placing said microelectronic component onto said drop with said mounting surface centered on said drop;

pressing together said microelectronic component and said substrate with said drop therebetween, so as to flatten said drop into a layer until said spacer elements contact said mounting surface and said facing surface; and then curing said adhesive.

14. The microelectronic package according to claim 1, wherein said anti-static agent is applied to said spacer elements.

15. The microelectronic package according to claim 1, wherein said anti-static agent is mixed in said adhesive.

16. The microelectronic package according to claim 1, wherein said spacer elements consist essentially of said plastic material, and said plastic material has a coefficient of thermal expansion on the order of $10^{-4}K^{-1}$ or $10^{-5}K^{-1}$.

17. The microelectronic package according to claim 16, wherein said coefficient of thermal expansion is in a range from $4 \times 10^{-5} K^{-1}$ to $6 \times 10^{-5} K^{-1}$.

18. The microelectronic package according to claim 17, wherein said plastic material is a mixture or copolymer of at least two different polymers.

19. A microelectronic package comprising:

a microelectronic component having a mounting surface;

a substrate having a facing surface; and an attachment layer that is interposed between and bonded to said mounting surface of said microelectronic component and said facing surface of said substrate so as to attach said microelectronic component onto said substrate;

wherein:

said attachment layer comprises a layer of an adhesive, plural generally ball-shaped spacer elements dispersed in said adhesive, and an anti-static agent applied to said spacer elements or mixed in said adhesive;

said spacer elements respectively have a nominal diameter that corresponds to a stand-off distance between said mounting surface of said microelectronic component and said facing surface of said substrate;

said spacer elements comprise a plastic material that is at least slightly elastically flexible and resilient; and said adhesive has a first coefficient of thermal expansion, and said plastic material of said spacer elements has a second coefficient of thermal expansion that at least approximately corresponds to said first coefficient of thermal expansion of said adhesive.

20. A microelectronic package comprising:

a microelectronic component having a mounting surface;

a substrate having a facing surface; and an attachment layer that is interposed between and bonded to said mounting surface of said microelectronic component and said facing surface of maid substrate so as to attach said microelectronic component onto said substrate;

wherein:

said attachment layer comprises a layer of an adhesive, plural generally ball-shaped spacer elements dispersed in said adhesive, and an anti-static agent applied to said spacer elements or mired in said adhesive;

said spacer elements respectively have a nominal diameter that corresponds to a stand-off distance between said mounting surface of said microelectronic component and said facing surface of said substrate;

said spacer elements comprise a material that is at least slightly elastically flexible and resilient; and said adhesive has a first coefficient of thermal expansion, and said material of said spacer elements has a second coefficient of thermal expansion that is not less than one tenth of said first coefficient of thermal expansion of said adhesive.

\* \* \* \* \*

UNITED STATES PATENT AND TRADEMARK OFFICE
CERTIFICATE OF CORRECTION

PATENT NO. : 6,740,982 B2  Page 1 of 1
DATED : May 25, 2004
INVENTOR(S) : Sauter et al.

It is certified that error appears in the above-identified patent and that said Letters Patent is hereby corrected as shown below:

Column 6,
Line 3, after "facing", replace "surf ace" by -- surface --;

Column 8,
Line 17, after "of", replace "maid" by -- said --.

Signed and Sealed this

Thirtieth Day of November, 2004

JON W. DUDAS
*Director of the United States Patent and Trademark Office*